United States Patent [19]

Waller, Jr.

[11] Patent Number: 4,745,309
[45] Date of Patent: May 17, 1988

[54] ADJUSTABLE RMS CIRCUIT

[76] Inventor: James K. Waller, Jr., 9901 Allen Rd., Clarkston, Mich. 48016

[21] Appl. No.: 912,526

[22] Filed: Sep. 29, 1986

[51] Int. Cl.[4] .......................... G02G 7/12; H03K 5/00; G01R 15/10
[52] U.S. Cl. ..................................... 307/490; 307/492; 328/26; 328/144; 328/145; 324/132
[58] Field of Search .......................... 328/144, 145, 26; 307/490, 492; 324/132; 364/852, 853, 854, 857

[56] References Cited

U.S. PATENT DOCUMENTS 3,657,528  4/1972  Plante ................................. 364/857
4,065,682  12/1977  Evans ................................. 364/857
4,109,165  8/1978  Katakura et al. ................... 328/145

Primary Examiner—Stanley D. Miller
Assistant Examiner—Trong Quang Phan
Attorney, Agent, or Firm—Frank John Catalano

[57] ABSTRACT

An adjustable RMS circuit for an input signal is first compressed by use of a bipolar logarithmic converter. The low-level, high-frequency accuracy of the converter may be improved by increasing its gain in response to the presence of such components. An inverted half wave rectified signal derived from the compressed signal is then combined with a half intensity signal derived from the compressed signal to produce a signal which is substantially equal to the absolute value of the compressed signal. A reference signal of variably selectable level is further combined with the combined signal to provide an output signal offset to a desired threshold level.

6 Claims, 2 Drawing Sheets

ADJUSTABLE RMS CIRCUIT

BACKGROUND

This invention relates to electronic measurement circuits used primarily for measurement or detection of audio signal level and more particularly to measurement circuits designed to produce an output proportional to the logarithm of the root mean square or RMS value of an input signal. RMS conversion is commonly known and used for the measurment of audio signal levels and many systems exist which utilize the process.

Some systems apply the input signal to a full wave rectifier circuit and then process the rectified output by a unipolar log converting circuit consisting of an inverting stage operational amplifier with a single feedback path through two semiconductor junctions. Such systems place stringent requirements on the low level accuracy of the full wave rectifier circuit. The inaccuracies become readily apparent at signal levels below 20 MV.

This problem is sometimes overcome by processing the input signal through a bi-polar logarithmic converter which provides greater accuracy at extremely low signal levels. However, such systems require complex external circuitry in order to control the output ratio of volts-per decibels of input signal and to adjust the output dc level at a predetermined voltage. Since easy external control of threshold and ratio functions is a desirable feature of many circuit designs using RMS detection, this solution is often inadequate.

SUMMARY

It is, therefore, a principal object of the present invention to provide an RMS converter having a high degree of accuracy. It is also an object of the present invention to facilitate scaling the output volts-per decibel ratio. It is a further object of the present invention to permit easy variation of its zero set point.

In accordance with the invention an adjustable RMS circuit for an input signal is provided which first compresses the input signal logarithmically and then derives the absolute value of the compressed signal. The absolute value signal is combined with a selectably variable reference signal to offset the level of the absolute value signal and thereby facilitate external variation of the circuit threshold level. In addition, a low-level, high-frequency feedback path may be provided in the logarithmic compression stage to improve the accuracy of the circuit.

BRIEF DESCRIPTION OF THE DRAWINGS

Other objects and advantages of the invention will become apparent upon reading the following detailed description and upon reference to the drawings in which.

DETAILED DESCRIPTION

Figure 1:
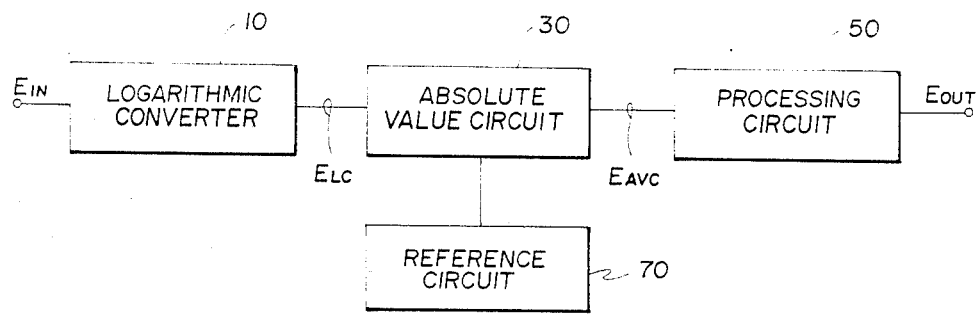
FIG. 1 is a block diagram of the embodiment of the present invention.
Figure 5:
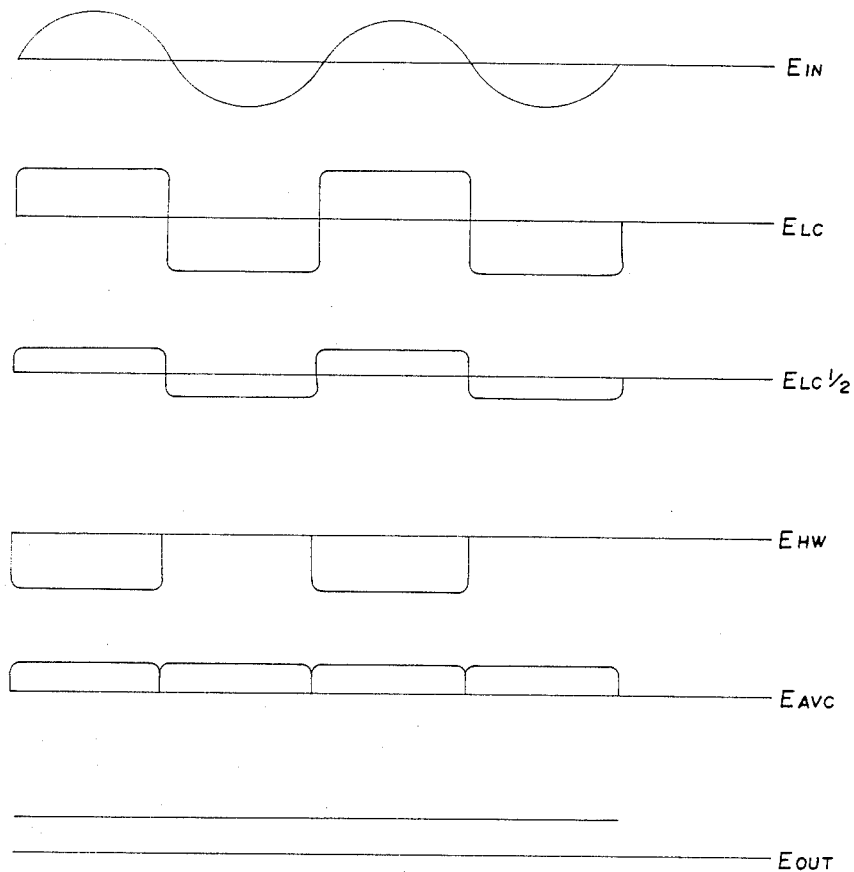
FIG. 5 is a representation of the wave forms which would be present at various points of the invention assuming a sine wave input.
Figure 2:
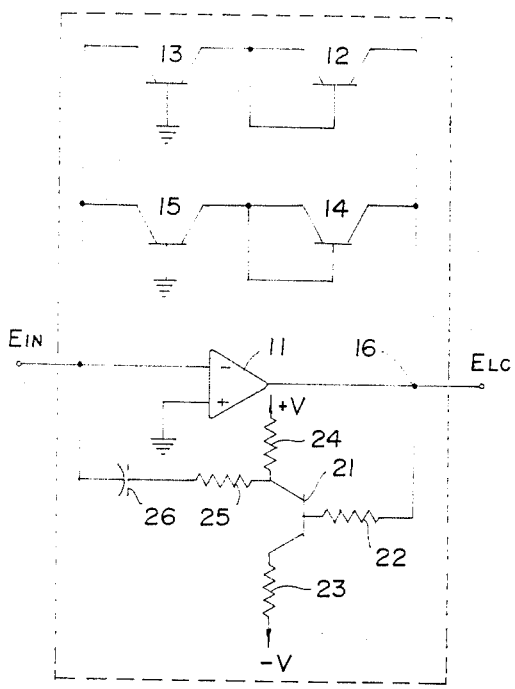
FIG. 2 is a schematic diagram of the bi-polar logarithmic converter of the present invention.

In the embodiment of the invention shown in FIG. 1, an input signal $E_{in}$ is logarithmically compressed in a bi-polar logarithmic amplifier 10. The compressed signal is then rectified in an absolute value circuit 30. The rectified signal is then peak detected, filtered and buffered in a processing stage 50. In the log converter circuit shown in FIG. 2, the input current $E_{in}$ is applied to an amplifier 11 which, in conjunction with transistors 12, 13, 14 and 15, forms a high gain inverting bi-polar logarithmic converter. The converter stage 10 incorporates two oppositely conductive feedback paths to process both the negative and positive portions of the input signal $E_{in}$. In one path a diode connected transistor 12 has its emitter connected to the output terminal of the amplifier 11 and its base and collector connected together and series connected with another transistor 13. The emitter of the second transistor 13 is tied to the base and collector of the first transistor 12. The base of the second transistor 13 is tied to ground and its collector is connected to the inverting input terminal of the amplifier 11. These transistors 12 and 13 conduct when the input signal is of negative polarity. The other feedback path consists of a diode connected transistor 14 having its base and collector tied together and its emitter connected to the output terminal of the amplifier 11. The base and collector of the third transistor 14 are connected to the emitter of a fourth transistor 15. The base of the fourth transistor 15 is connected to ground and its collector is connected to the inverting input terminal of the amplifier 11. These transistors 14 and 15 conduct when the input signal $E_{in}$ is of positive polarity. Since the base-emitter voltage of a silicon transistor is logarithmically related to its collector current, it is clear that, with two semiconductor junctions in the feedback paths around the amplifier 11, its output will be compressed to be directly proportional to two times the logarithm of the input signal $E_{in}$. As shown in FIG. 5, if a sine wave input signal $E_{in}$ were applied to the converter 10, its compressed output signal appearing at node 16 would appear as signal $E_{LC}$ depicted in FIG. 5.

At low signal levels, say in the range of −60 to −90dBV, the accuracy of the logarithmic converter 10 may perceptibly diminish, and this inaccuracy becomes more extreme at higher frequencies. Therefore, given low input signal levels, performance of the system is good at low frequencies, acceptable in the mid frequency range and in need of improvement in the high frequency range. Consequently, in some applications, the logarithmic converter 10 may also include a third feedback path from the output of the amplifier 11 to its inverting input terminal. This third feedback path includes a transistor 21 having its base connected to the output of the amplifier 11 through a current limiting resistor 22. The emitter of the transistor 21 is negatively biased through a resistor 23 and its collector is positively biased through a resistor 24. The collector is connected to the inverting input terminal of the amplifier 11 through a high pass filter consisting of a resistor 25 and a capacitor 26. At high frequencies this feedback path permits an increase in the gain of the amplifier 11 by adding a high frequency component which significantly raises the level of low level signals, thereby improving the accuracy of the system.

Figure 3:
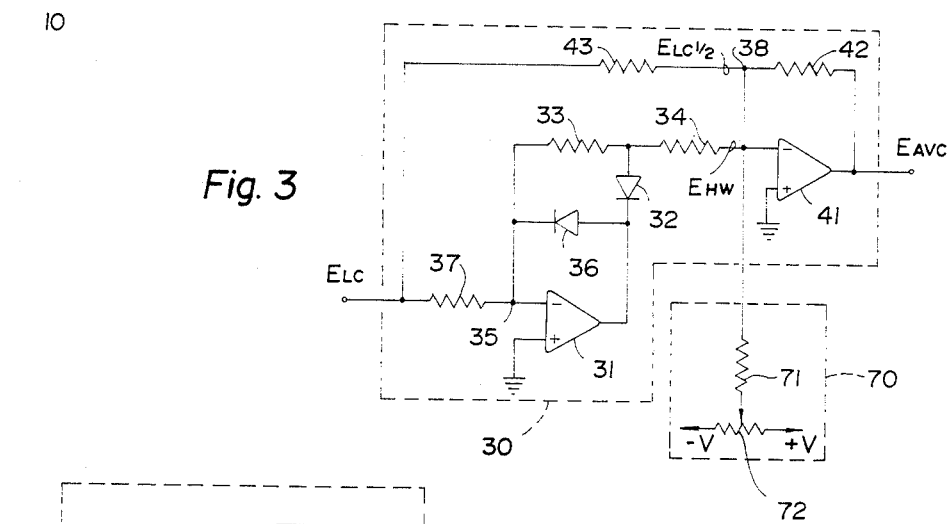
FIG. 3 is a schematic diagram of the absolute value circuit of the present invention.

The compressed output $E_{LC}$ of the bi-polar logarithmic converter 10 is applied to the absolute value circuit or full wave rectifier 30 shown in FIG. 3. An amplifier 31 functions as a half wave inverting rectifier producing an inverted half wave replica $E_{HW}$ of the compressed output signal $E_{LC}$. A first diode 32 has its cathode connected to the output of the amplifier 31 and its anode connected between series connected resistors 33 and 34. The other end of series connected resistor 33 is connected to the inverting node 35 of the amplifier 31. A second diode 36 is connected in the feedback loop of the amplifier 31 and has its anode connected to the output of the amplifier 31 and its cathode to the inverting node 35 of the amplifier 31. Another resistor 37 is connected between the output $E_{LC}$ of the converter 10 and the inverting node 35 of the amplifier 31.

Figure 4:
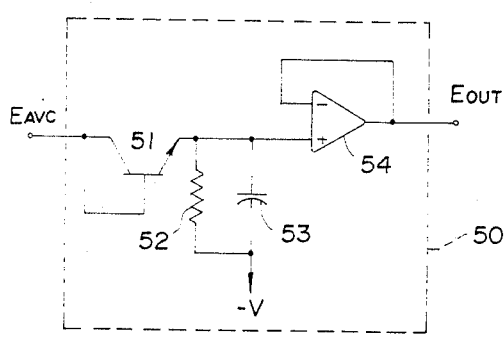
FIG. 4 is a schematic diagram of the processing stage of the present invention.

The inverting node connected resistors 33 and 37 are selected to be equal in value. When the output signal of the converter 10 is positive the output of the rectifying amplifier 31 is negative, closing the negative feedback loop through the resistor 33. The output signal present at node 38 will therefore appear as $E_{HW}$ in FIG. 5. An inverting summing amplifier 41 has a resistor 42 connected in the feedback loop between its output and its summing input. Another resistor 43 is connected between the output of the converter 10 and the summing node of the inverting summing amplifier 41. The resistor 34 connected to the node 38 is connected at its other end to the summing input of the summing amplifier 41. The resistors 42 and 43 are selected to be equal in value to resistors 33 and 37. The resistor 34 is selected to be half the value of the resistor 42. The output of the inverting summing amplifier 41 would then appear as signal $E_{AVC}$ in FIG. 5, which is equivalent to the absolute value of two times the logarithm of the input signal $E_{in}$. Referring to FIG. 4, the output of the summing amplifier 41 is then fed to the processing stage 50 where it is peak detected through a diode connected transistor 51 having its base and collector connected to the output of the summing amplifier 41. The emitter of the transistor 51 is connected to a constant current source consisting of a resistor 52 and a filter capacitor 53. This filtered signal is then applied to the non-inverting input of a buffer amplifier 54. The output $E_{out}$ of the buffer amplifier 54 is a dc voltage equal to the logarithm of the RMS value of the input signal $E_{in}$.

An external control circuit 70 consists of a resistor 71 connected between the summing node of the inverting summing amplifier 41 and the wiper of a variable resistor 72 having its ends connected to positive and negative voltage sources. The adjusting variable resistor 72 permits adjustment of the output offset voltage $E_{AVC}$ at the output of the summing amplifier 41. This allows adjustment of the output dc voltage $E_{out}$, thereby allowing adjustment of the zero set point of the adjustable RMS circuit. Adjustment of the zero set point is desirable and can be used to control the threshold of operation in many other circuit designs, such as compressors, expanders, and voltage controlled filter applications. The dc output voltage $E_{out}$ is linear in volts per decibel of input signal $E_{in}$ and can be scaled simply by adjusting the value of the resistor 42 in the absolute value circuit 30. The resistor 42 may alternatively be replaced by a variable resistor so as to produce easy control of this ratio adjustment. It should also be understood that the transistors 12, 13, 14, 15, and 51 could be replaced by common small signal diodes and still permit acceptable performance. However, such a modification may produce a slight reduction in the degree of accuracy.

It will be apparent to those skilled in the art that many alternatives may be chosen and modifications made in the invention herein described without departing from the scope of the invention. All matters contained in this description or shown in the drawings is illustrative and not a limitation of the scope of the invention. Accordingly, it is intended that the scope of this invention includes all such alternatives and modifications as are apparent from the description or drawings or the appended claims.

What is claimed is:

1. An adjustable RMS circuit for an input signal comprising:

means for compressing said input signal proportionately in relation to its logarithm to provide a compressed signal;

means for deriving from said compressed signal an inverted half wave rectified signal proportional to said compressed signal to provide a first rectified signal;

means for deriving from said compressed signal a signal half the magnitude of said inverted half wave rectified signal to provide a second rectified signal;

means for generating a reference signal of variably selectable level; and means for combining said first rectified signal with said second recified signal and with said reference signal to provide a signal proportionate to the absolute value of said compressed signal offset by the preselected level of said reference signal.

2. An adjustable RMS circuit according to claim 1 wherein said means for compressing further comprises means for adding to said input signal a low level, high frequency component of said compressed signal whereby the level of said compressed signal is increased when said input signal contains low level, high frequency components.

3. An adjustable RMS circuit for an input signal comprising:

a bipolar logarithmic amplifier having an output terminal, an inverting input terminal for receiving said input signal and a grounded non-inverting input terminal;

a first feedback path from said output terminal to said inverting input terminal, said first feedback path having means for deriving the logarithm of the positive components of said input signal to provide a positive logarithmic signal at said inverting input terminal;

a second feedback path from said output terminal to said inverting input terminal, said second feedback path having means for deriving the logarithm of the negative components of said input signal to provide a negative logarithmic signal at said inverting input terminal;

said amplifier being responsive to said positive and negative logarithmic signals to provide a signal at said output terminal directly proportional to the logarithm of said input signal;

a summing amplifier having an output terminal, a summing input terminal and a grounded non-inverting input terminal;

a current source;

a first signal path from said bipolar logarithmic amplifier output terminal to said summing input terminal, said first signal path having means for deriving an inverted half wave rectified signal proportional to said bipolar logarithmic amplifier output signal to provide a first rectified signal to said summing input terminal;

a second signal path from said bipolar logarithmic amplifier output terminal to said summing input terminal, said second signal path having means for deriving a full wave signal of half the magnitude of said inverted half wave rectified signal to provide a second rectified signal to said summing input terminal;

a third signal path from said current source to said summing input terminal, said third signal path having means for deriving a dc signal of variably selectable signal level to provide a reference signal to said summing input terminal;

said summing amplifier being responsive to said first and second rectified signals and said reference signal to produce a signal at said summing amplifier output terminal proportional to the absolute value of said bipolar logarithmic amplifier signal offset by said dc signal.

4. An adjustable RMS circuit according to claim 3 further comprising:

a third feedback path from said bipolar logarithmic amplifier output terminal to said inverting input terminal having means for passing only low-level, high-frequency components of said input signal back to said inverting input terminal.

5. A method of deriving an adjustable control signal from an input signal comprising the steps of:

logarithmically compressing said input signal to provide a compressed signal;

inverting and half wave rectifying said compressed signal to provide a first rectified signal;

attenuating said compressed signal to one half the magnitude of said inverted half wave rectified signal to provide a second rectified signal;

generating a reference signal of variably selectable level;

combining said first rectified signal, said second rectified signal and said reference signal to produce a signal proportional to the absolute value of said compressed signal offset by the preselected level of said reference signal.

6. A method according to claim 5 wherein said logarithmically compressing step includes the step of amplifying the low-level, high-frequency components of said input signal.

* * * * *